US011075292B2

(12) United States Patent
Lo

(10) Patent No.: US 11,075,292 B2
(45) Date of Patent: Jul. 27, 2021

(54) INSULATED GATE BIPOLAR TRANSISTOR, AND MANUFACTURING METHOD THEREFOR

(71) Applicant: CSMC TECHNOLOGIES FAB2 CO., LTD., Jiangsu (CN)

(72) Inventor: Tse-Huang Lo, Taiwan (CN)

(73) Assignee: CSMC TECHNOLOGIES FAB2 CO., LTD., Wuxi New District (CN)

(*) Notice: Subject to any disclaimer, the term of this patent is extended or adjusted under 35 U.S.C. 154(b) by 0 days.

(21) Appl. No.: 16/864,263

(22) Filed: May 1, 2020

(65) Prior Publication Data
US 2020/0259006 A1     Aug. 13, 2020

Related U.S. Application Data

(63) Continuation-in-part of application No. PCT/CN2018/117562, filed on Nov. 27, 2018.

(30) Foreign Application Priority Data

Dec. 5, 2017 (CN) .......................... 201711270146.8

(51) Int. Cl.
*H01L 29/739*      (2006.01)
*H01L 21/265*      (2006.01)
(Continued)

(52) U.S. Cl.
CPC ...... *H01L 29/7397* (2013.01); *H01L 21/0274* (2013.01); *H01L 21/26513* (2013.01);
(Continued)

(58) Field of Classification Search
CPC ............. H01L 29/7397; H01L 21/0274; H01L 29/0821; H01L 29/4236; H01L 21/26513; H01L 21/02835
(Continued)

(56) References Cited

U.S. PATENT DOCUMENTS

2004/0256666 A1   12/2004   Fujishima et al.
2008/0035987 A1   2/2008   Herbert
(Continued)

FOREIGN PATENT DOCUMENTS

CN    101771049 A    7/2010
CN    101853852 A    10/2010
(Continued)

OTHER PUBLICATIONS

Office Action dated Dec. 19, 2019 issued in corresponding Chinese Patent Application No. 201711270146.8 (5 pages).
(Continued)

*Primary Examiner* — Thinh T Nguyen
(74) *Attorney, Agent, or Firm* — Polsinelli PC

(57) ABSTRACT

An insulated gate bipolar transistor includes a substrate; a first conductivity type base disposed on the substrate and having a first trench; a first conductivity type buffer region disposed in the first conductivity type base; a collector doped region having a second conductivity type and disposed in the first conductivity type base; a second conductivity type base to which the first trench extends downwardly; a gate oxide layer disposed on an inner surface of the first trench; a polysilicon gate disposed inside the gate oxide layer; an emitter doped region having a first conductivity type and disposed in the second conductivity type base and under the first trench; a conductive plug extending downwardly from above the first trench and contacting the
(Continued)

second conductivity type base; and an insulating oxide layer filled in the first trench, the insulating oxide layer insulating and isolating the polysilicon gate from the emitter doped region.

20 Claims, 9 Drawing Sheets

(51) Int. Cl.
| | | |
|---|---|---|
| *H01L 21/027* | (2006.01) | |
| *H01L 21/28* | (2006.01) | |
| *H01L 21/306* | (2006.01) | |
| *H01L 21/3213* | (2006.01) | |
| *H01L 21/762* | (2006.01) | |
| *H01L 29/06* | (2006.01) | |
| *H01L 29/08* | (2006.01) | |
| *H01L 29/423* | (2006.01) | |
| *H01L 29/49* | (2006.01) | |
| *H01L 29/66* | (2006.01) | |

(52) U.S. Cl.
CPC .. *H01L 21/28035* (2013.01); *H01L 21/30604* (2013.01); *H01L 21/32133* (2013.01); *H01L 21/76224* (2013.01); *H01L 29/0649* (2013.01); *H01L 29/0804* (2013.01); *H01L 29/0821* (2013.01); *H01L 29/4236* (2013.01); *H01L 29/4916* (2013.01); *H01L 29/66348* (2013.01)

(58) Field of Classification Search
USPC .......................... 257/144, 135; 438/137, 138
See application file for complete search history.

(56) References Cited

U.S. PATENT DOCUMENTS

| | | |
|---|---|---|
| 2012/0267713 A1 | 10/2012 | Hsu et al. |
| 2013/0341705 A1 | 12/2013 | Raghavan et al. |
| 2018/0145147 A1* | 5/2018 | Omura et al. .... H01L 29/66348 |

FOREIGN PATENT DOCUMENTS

| | | |
|---|---|---|
| CN | 102945808 A | 2/2013 |
| CN | 103545370 A | 1/2014 |
| CN | 105932042 A | 9/2016 |
| CN | 106158939 A | 11/2016 |
| CN | 106252396 A | 12/2016 |
| CN | 107425056 A | 12/2017 |
| JP | 2015-195286 A | 11/2015 |
| JP | 2015195286 A | 11/2015 |

OTHER PUBLICATIONS

Office Action dated May 21, 2020 issued in corresponding Chinese Patent Application No. 201711270129.4 (9 pages).
International Search Report dated Feb. 27, 2019 in counterpart Patent Application PCT/CN2018/117562 (2 pages).
Chinese Office Action dated Apr. 24, 2020 in counterpart Patent Application No. 201711269321.1 (8 pages).

* cited by examiner

INSULATED GATE BIPOLAR TRANSISTOR, AND MANUFACTURING METHOD THEREFOR

CROSS-REFERENCE TO RELATED APPLICATIONS

The present application is a Continuation-in-Part of International Application No. PCT/CN2018/117562 filed on Nov. 27, 2018, which claims priority to Chinese Patent Application No. 201711270146.8, filed on Dec. 5, 2017. Both applications are incorporated herein by reference in their entireties.

TECHNICAL FIELD

The disclosure relates to the field of semiconductor manufacturing, particularly to an insulated gate bipolar transistor (IGBT) structure and a manufacturing method thereof.

BACKGROUND

A conventional IGBT has a vertical structure with a collector located at a lower position. However, it is difficult to lead the collector from a substrate to a front side when it is expected to be applied to an integration process.

SUMMARY

According to various embodiments of the present disclosure, an insulated gate bipolar transistor and a manufacturing method thereof are provided.

An insulated gate bipolar transistor includes a substrate; a first conductivity type base disposed on the substrate and having a first trench extending downwardly from a surface thereof; a first conductivity type buffer region disposed in the first conductivity type base and on both sides of the first trench; a collector doped region having a second conductivity type and disposed in the first conductivity type base and on both sides of the first trench; a second conductivity type base to which the first trench extends downwardly; a gate oxide layer disposed on an inner surface of the first trench; a polysilicon gate disposed inside the gate oxide layer, the trench being partially filled with the polysilicon gate at part of the bottom and a sidewall thereof; an emitter doped region having a first conductivity type, the emitter doped region being disposed in the second conductivity type base and under the first trench between the polysilicon gates; a conductive plug extending downwardly from above the first trench and contacting the second conductivity type base after extending through the emitter doped region; and an insulating oxide layer filled in the first trench between the conductive plug and the polysilicon gate, the insulating oxide layer covering the polysilicon gate and insulating and isolating the polysilicon gate from the emitter doped region.

A manufacturing method of an insulated gate bipolar transistor includes steps: S110, providing a wafer having a first conductivity type base formed on a substrate; S120, forming a trench extending downwardly from a surface of the first conductivity type base, the trench including a first trench; S130, forming a gate oxide layer on an inner surface of the first trench; S140, filling the first trench full with polysilicon; S150, etching the polysilicon to a predetermined thickness, and forming a polysilicon layer of the predetermined thickness at the bottom of the first trench; S160, forming a first insulating oxide layer on a surface of the polysilicon layer and a sidewall of the first trench; S170, etching the first insulating oxide layer and the polysilicon layer downward to expose the bottom of the first trench with a part of the polysilicon layer and the first insulating oxide layer located at the sidewall of the first trench being retained; S180, forming a second conductivity type base under the first trench and forming an emitter doped region of the first conductivity type in the second conductivity type base; S190, forming a second insulating oxide layer in the first trench to insulate and isolate the polysilicon layer from the emitter doped region; and S210, forming a first conductivity type buffer region, a collector doped region and a conductive plug; wherein the first conductivity type and the second conductivity type are opposite conductivity types.

Details of one or more embodiments of the present disclosure are set forth in the accompanying drawings and description below. Other features, objects, and advantages of the disclosure will become apparent from the description, the drawings, and the claims.

DETAILED DESCRIPTION

In order to facilitate understanding of the present disclosure, the present disclosure will be described more fully with reference to the accompanying drawings. The drawings show a preferred embodiment of the disclosure. However, the present disclosure can be implemented in many different forms and is not limited to the embodiments described herein. Rather, these embodiments are provided so that this disclosure will be thorough and complete.

Unless defined otherwise, all technical and scientific terms used herein have the same meaning as commonly understood by one of ordinary skill in the art to which this disclosure belongs. The terms used herein in the description of the disclosure are for the purpose of describing particular embodiments only and are not intended to limit the invention. The term "and/or" as used herein includes any and all combinations of one or more of the associated listed items.

The vocabularies in the semiconductor field used in this specification are technical vocabularies commonly used by those skilled in the art. For example, for P-type and N-type impurities, in order to differentiate the doping concentration, P+-type stands for heavily doped P-type. P-type stands for moderately doped P-type. P--type stands for lightly doped P-type. N+-type stands for heavily doped N-type. N-type stands for moderately doped N-type. N--type stands for lightly doped N-type.

Figure 1:
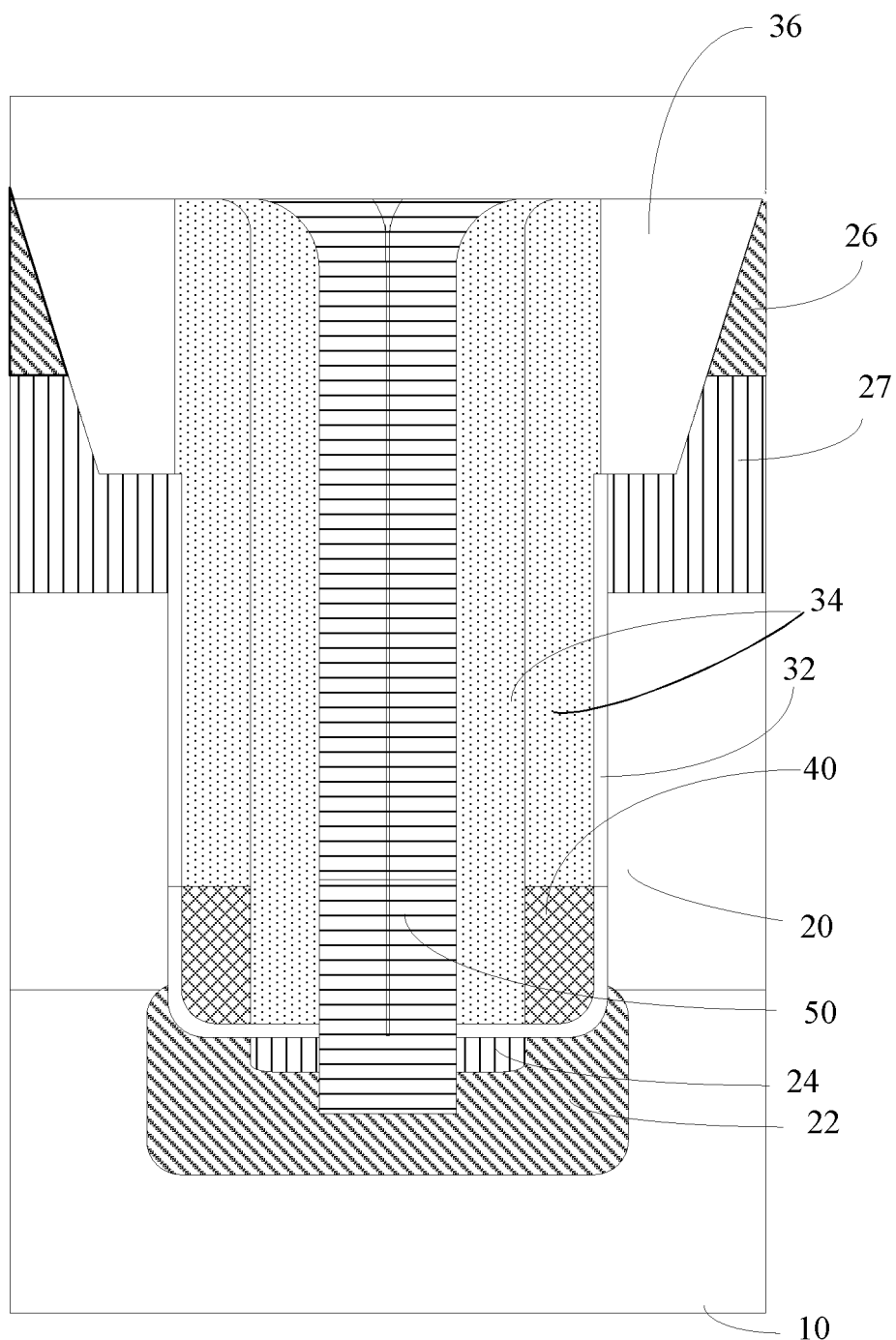
FIG. 1 is a schematic cross-sectional view of an insulated gate bipolar transistor according to an embodiment.

FIG. 1 is a schematic cross-sectional view of an insulated gate bipolar transistor according to an embodiment, which includes a substrate 10, a first conductivity type base 20, a second conductivity type base 22, an emitter doped region 24, a collector doped region 26, a polysilicon gate 40, a gate oxide layer 32, an insulating oxide layer 34 and a conductive plug 50. In this embodiment, the substrate 10 is a silicon substrate.

The first conductivity type base 20 is disposed on the substrate 10. At least one first trench (not labeled in FIG. 1) extends downwardly from a surface of the first conductivity type base 20 to the second conductivity type base 22. The gate oxide layer 32 is disposed on an inner surface of the first trench. The first trench is partially filled with the polysilicon gate 40 at the bottom thereof near the sidewall. The polysilicon gate 40 is shown in the cross-sectional view (FIG. 1) as being on both sides of the bottom of the first trench and located on the gate oxide layer 32. The emitter doped region 24 has a first conductivity type, and is disposed in the second conductivity type base 22 and also under the part of the first trench between the polysilicon gates 40. The conductive plug 50 extends downwardly from above the first trench and contacts the second conductivity type base 22 through the emitter doped region 24. The insulating oxide layer 34 is filled into the first trench and located between the conductive plug 50 and the polysilicon gate 40 so as to fill the remaining space in the first trench. The insulating oxide layer 34 covers the polysilicon gate 40, and thereby insulates and isolates the polysilicon gate 40 from the emitter doped region 24. The insulating oxide layer 34 can be composed collectively or partly by oxide layers applied during the manufacture, such as a first insulating oxide layer and a second insulating oxide layer as will be described below.

The collector doped region 26 has a first conductivity type, and is disposed outside the first trench and obliquely above the emitter doped region 24. The collector doped region 26 is disposed in the first conductivity type base 20 in an embodiment. In the present embodiment, the first conductivity type is N-type and the second conductivity type is P-type. Accordingly, the second conductivity type base 22 is a P-type well and the first conductivity type base 20 is a high-voltage N-type well. In other embodiments, the first conductivity type may be P-type, and the second conductivity type may be N-type.

The gate of the above-described insulated gate bipolar transistor is buried in the device by a deep trench process to form a vertical channel region, which minimizes the lateral pitch required by the high-voltage device. The larger the size of the drift region, the larger the area is saved. Moreover, the collector is at an upper position, and in contrast to being at a lower position in a conventional IGBT structure, the gate, the collector and the emitter of the device can be led out from a front side, which is more convenient and compatible with conventional isolation processes (such as STI).

In an embodiment, the material of the insulating oxide layer 34 includes silicon oxide.

In an embodiment, the material of the conductive plug 50 includes metal. In another embodiment, the material of the conductive plug 50 includes alloy. In yet another embodiment, the materials of the conductive plug 50 include metal and metal nitride. The conductive plug 50 has an equivalent performance of a finger-shaped metal thermal sheet inserted into the device, providing a heat dissipation path extending vertically into the device, which efficiently transfers and dissipates heat, thereby improving the thermal breakdown resistance of the device.

In the embodiment shown in FIG. 1, an isolation structure 36 is further disposed between the collector doped region 26 and the first trench. The isolation structure 36 is used as a hard mask during the etching of the first trench. Specifically, after performing photolithography, the isolation structure is etched to the bottom thereof with an etchant suitable for etching the isolation structure (silicon oxide). The etching window resulted by photolithography is smaller than the isolation structure 36, so that there is still a part of the isolation structure 36 retained around the resulted first trench after etching. A desired depth of the first trench is then achieved by etching with an etchant suitable for silicon by taking the retained isolation structure 36 as a hard mask. It can be understood that a large number of isolation structures are formed in the wafer, and the isolation structure 36 as a hard mask during the etching of the first trench is only a part of them.

In an embodiment, the isolation structure 36 is a shallow trench isolation structure (STI). In another embodiment, the isolation structure 36 is field oxygen formed by LOCOS.

In the embodiment shown in FIG. 1, the insulated gate bipolar transistor further includes a first conductivity type buffer region 27 disposed in the first conductivity type base 20 and under the collector doped region 26.

Figure 2:
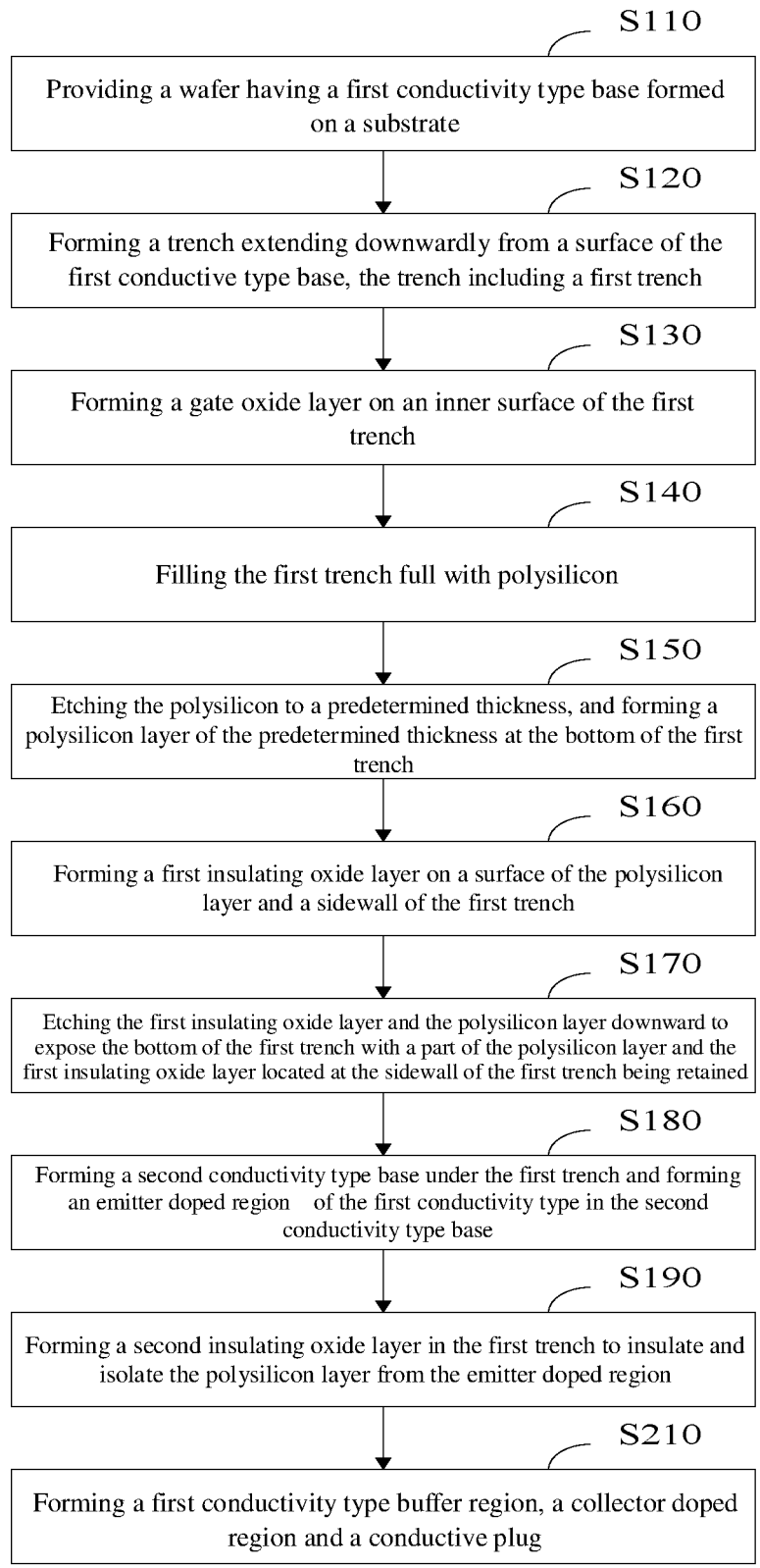
FIG. 2 is a flowchart of a manufacturing method of an insulated gate bipolar transistor according to an embodiment.

FIG. 2 is a flowchart of a manufacturing method for an insulated gate bipolar transistor according to an embodiment, which includes the following steps:

S110, providing a wafer having a first conductivity type base formed on a substrate.

In this embodiment, the substrate is a silicon substrate, and the first conductivity type is N-type and the second conductivity type is P-type. In other embodiments, the first conductivity type may be P-type, and the second conductivity type may be N-type.

S120, forming a trench extending downwardly from a surface of the first conductivity type base, the trench including a first trench.

Figure 3A:
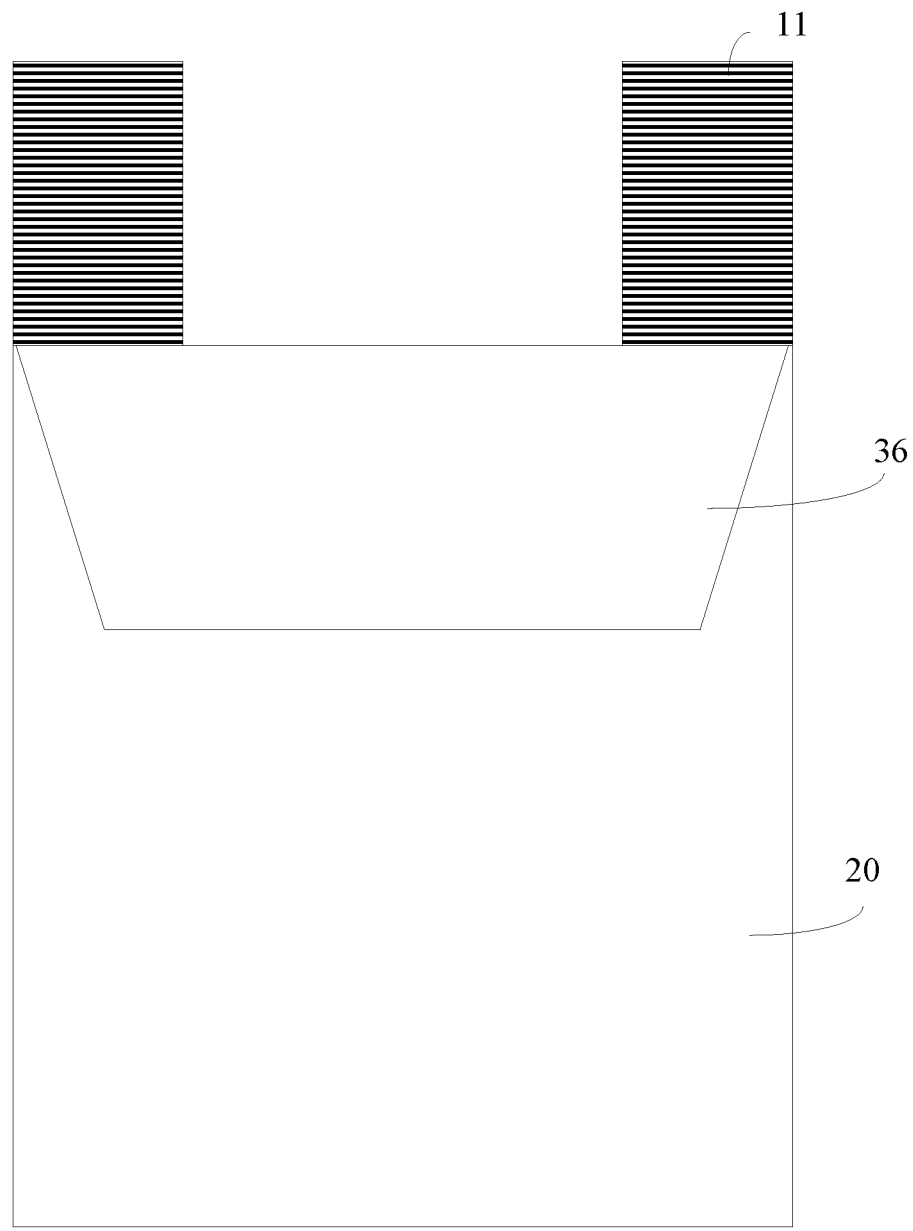
FIG. 3a~3f are schematic cross-sectional views of a device after each intermediate step of a manufacturing method of an insulated gate bipolar transistor according to an embodiment.
Figure 3B:
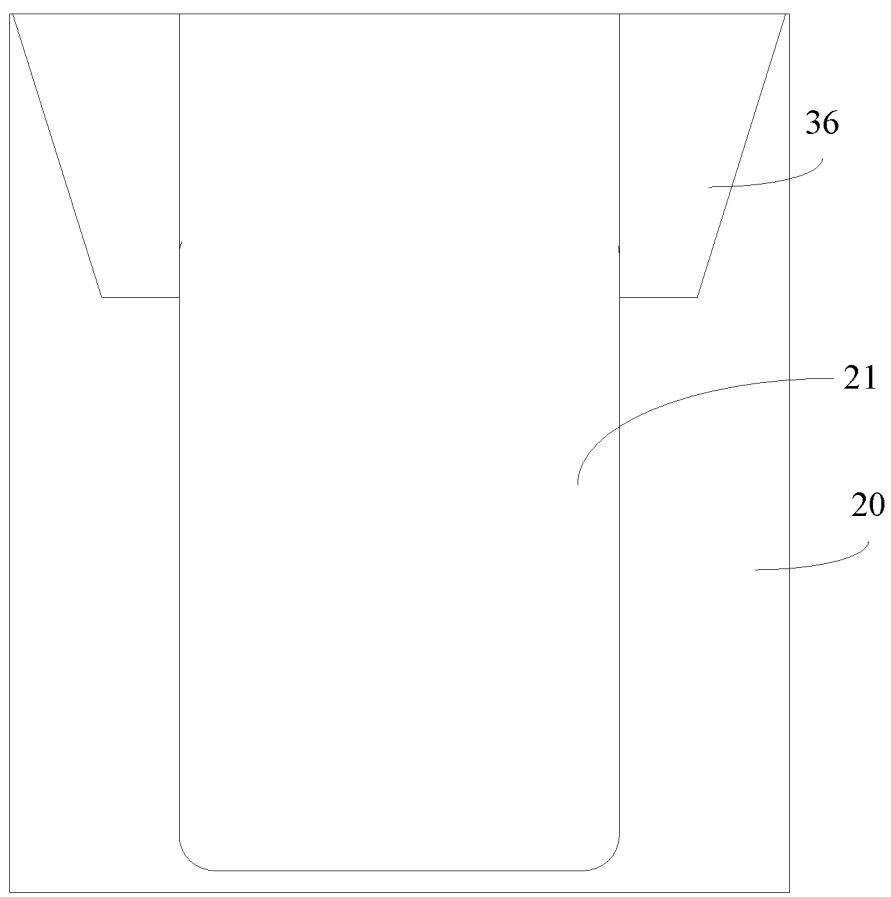

In this embodiment, the wafer provided in the step S110 is further formed with an isolation structure 36, as shown in FIG. 3a. In an embodiment, the isolation structure 36 is a shallow trench isolation (STI) structure. In another embodiment, the isolation structure 36 is field oxygen formed by local oxidation of silicon (LOCOS). In this embodiment, the step S120 includes forming a patterned photoresist 11 by performing photolithography to expose a corresponding part of the isolation structure 36 and block the remaining part of the same, according to the size requirements of the first trench, and etching the isolation structure 36 with an etchant suitable for silicon oxide by taking the patterned photoresist 11 as a mask. Referring to FIG. 3b, after the isolation structure 36 is etched through, the first conductivity type base 20 is etched downward to form the first trench by taking the retained isolation structure 36 protected by the patterned photoresist 11 from being etched as a hard mask. In an embodiment, the photoresist could be stripped before the downward etching using the isolation structure 36 as a hard mask.

S130, forming a gate oxide layer on an inner surface of the first trench.

Figure 3C:
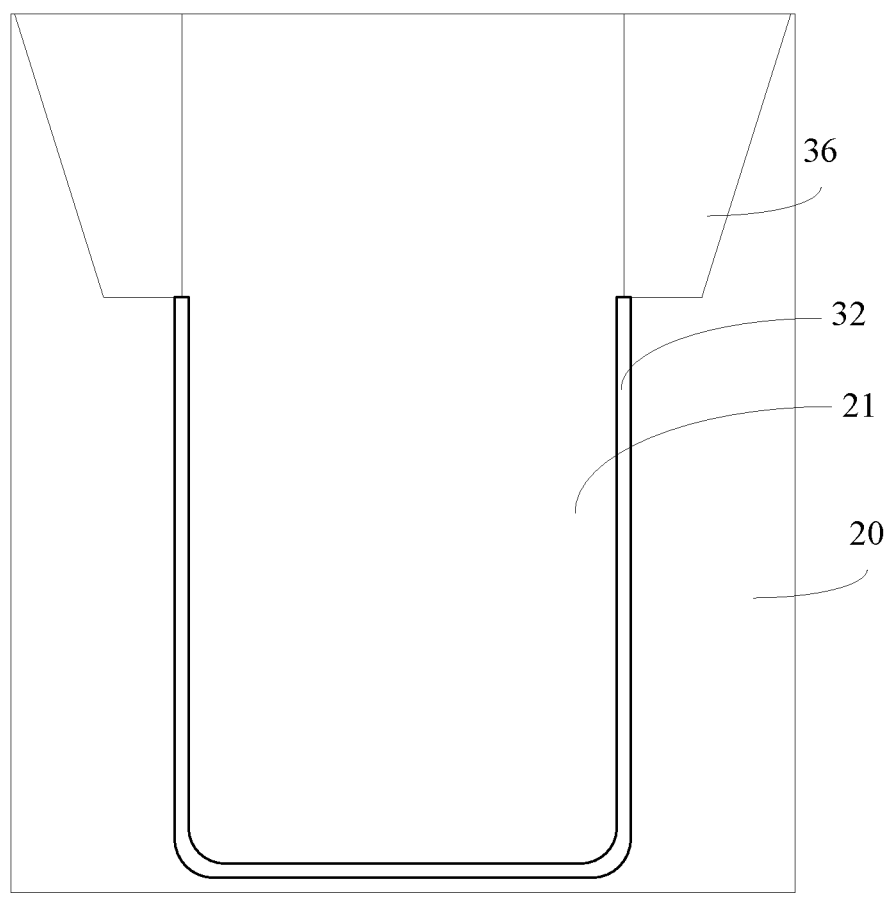

The gate oxide layer 32 can be formed through a thermal oxidation process. For the inner surface of the first trench 21, the gate oxide layer 32 will be only formed on the surface of the silicon (the first conductivity type base 20), but not on the surface of the isolation structure 36, as shown in FIG. 3c.

S140, filling the first trench full with polysilicon.

In an embodiment, the polysilicon can be filled by a deposition process, and a deposited polysilicon layer may overflow out of the trench.

S150, etching the polysilicon to a predetermined thickness, and forming a polysilicon layer of the predetermined thickness at the bottom of the first trench.

Figure 3D:
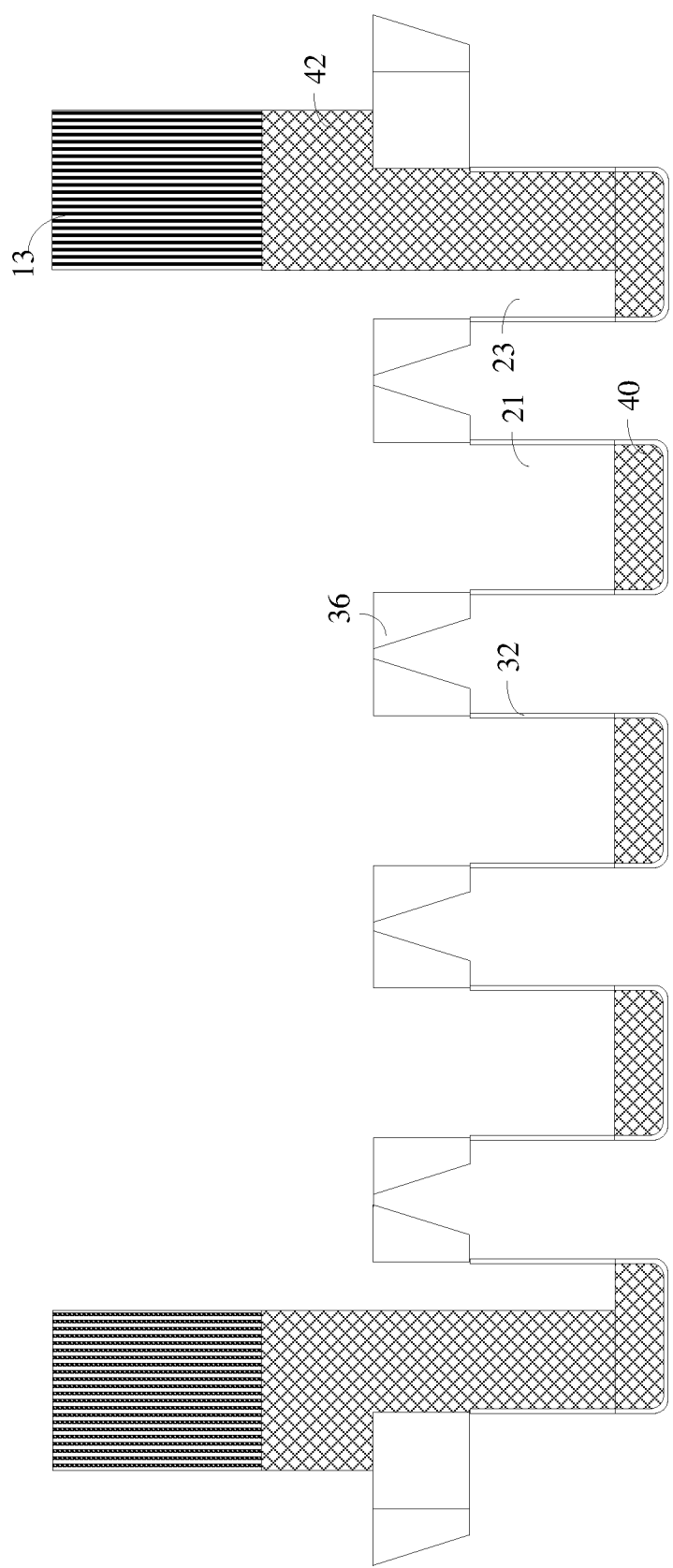

In an embodiment, the trenches obtained in the step S120 include a first trench 21 and a second trench 23. The second trench 23 has a ring shape and thus can be seen on both sides of the sectional view in FIG. 3d. A plurality of first trenches 21 are formed between the two second trenches 23. Similarly, in the step S130, a gate oxide layer 32 is also formed on an inner surface of the second trench 23, and in the step S140, the second trench 23 is also filled with polysilicon, as shown in FIG. 3d. In the step S150, photolithography is performed to form a patterned photoresist 13 prior to etching, and the polysilicon in the second trench 23 is at least partially blocked by the patterned photoresist 13, so that a gate lead-out structure extending out of the second trench 23 is formed after the etching. The patterned photoresist 13 is stripped after etching. Similarly, a polysilicon gate 40 is formed at the bottom of the first trench 21.

In an embodiment, the etching of the first trench 21 and the second trench 23 can be performed simultaneously, so that only one step of photolithography (the photolithography required for etching the isolation structure 36) is required. In other embodiments, the first trench 21 and the second trench 23 may also be etched separately, that is, the first trench 21 and the second trench 23 may be etched with different photomasks so as to obtain different depths for the first trench 21 and the second trench 23.

S160, forming a first insulating oxide layer on a surface of the polysilicon layer and a sidewall of the first trench.

Figure 3E:
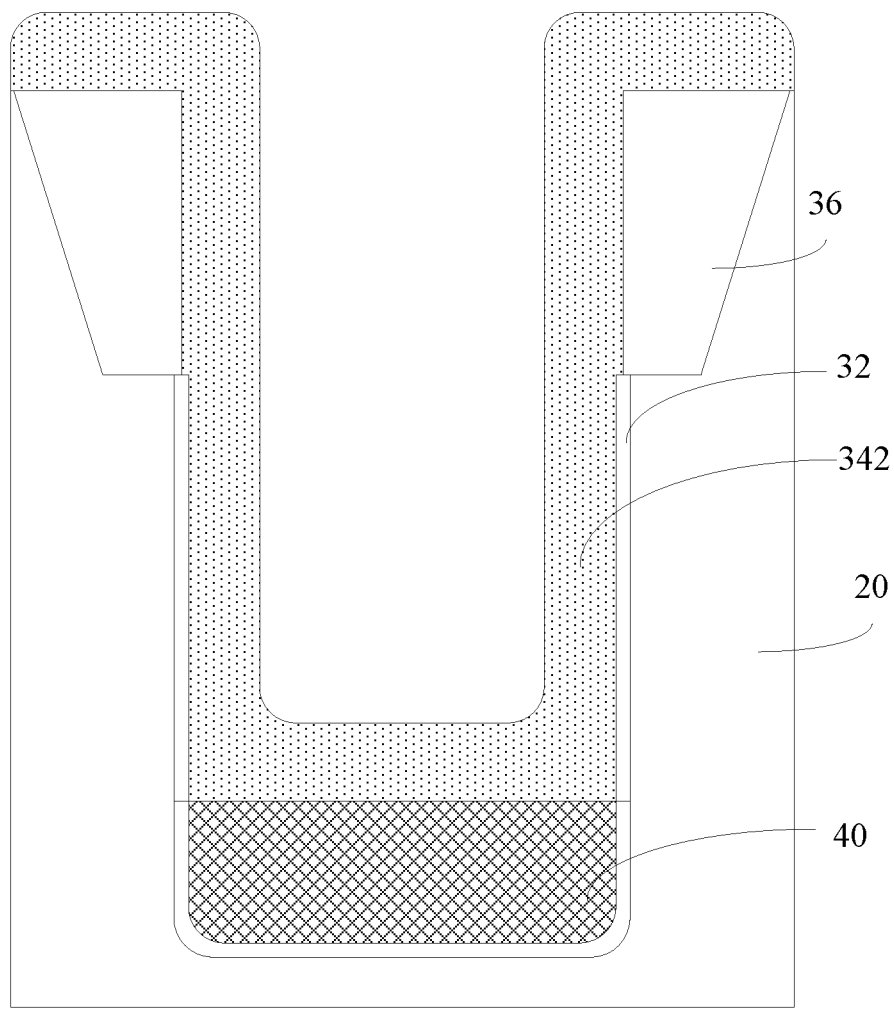

In an embodiment, a first insulating oxide layer 342 may be formed by a deposition process, as shown in FIG. 3e. In this embodiment, the material of the first insulating oxide layer 342 includes silicon oxide. It can be understood that, for the embodiments in which the second trench 23 is required, the first insulating oxide layer is also formed on the surface of the polysilicon layer of the second trench 23.

S170, etching the first insulating oxide layer and the polysilicon layer downward to expose the bottom of the first trench with a part of the polysilicon layer and the first insulating oxide layer located at the sidewall of the first trench being retained.

In an embodiment, the first insulating oxide layer 342 is etched back first. A part of the first insulating oxide layer 342 that is located on the sidewall of the first trench is retained after the etching back, but another part that is located in the middle of the first trench is etched away to expose the polysilicon gate 40. An etchant suitable for silicon oxide is used for the etching without any usage of photoresist. The polysilicon gate 40 is then etched with an etchant suitable for etching the polysilicon by taking the first insulating oxide layer 342 as a mask to expose the bottom of the first trench, a part of the polysilicon layer that is located on the sidewall of the first trench is retained after the etching.

S180, forming a second conductivity type base under the first trench and forming an emitter doped region of the first conductivity type in the second conductivity type base.

Figure 3F:
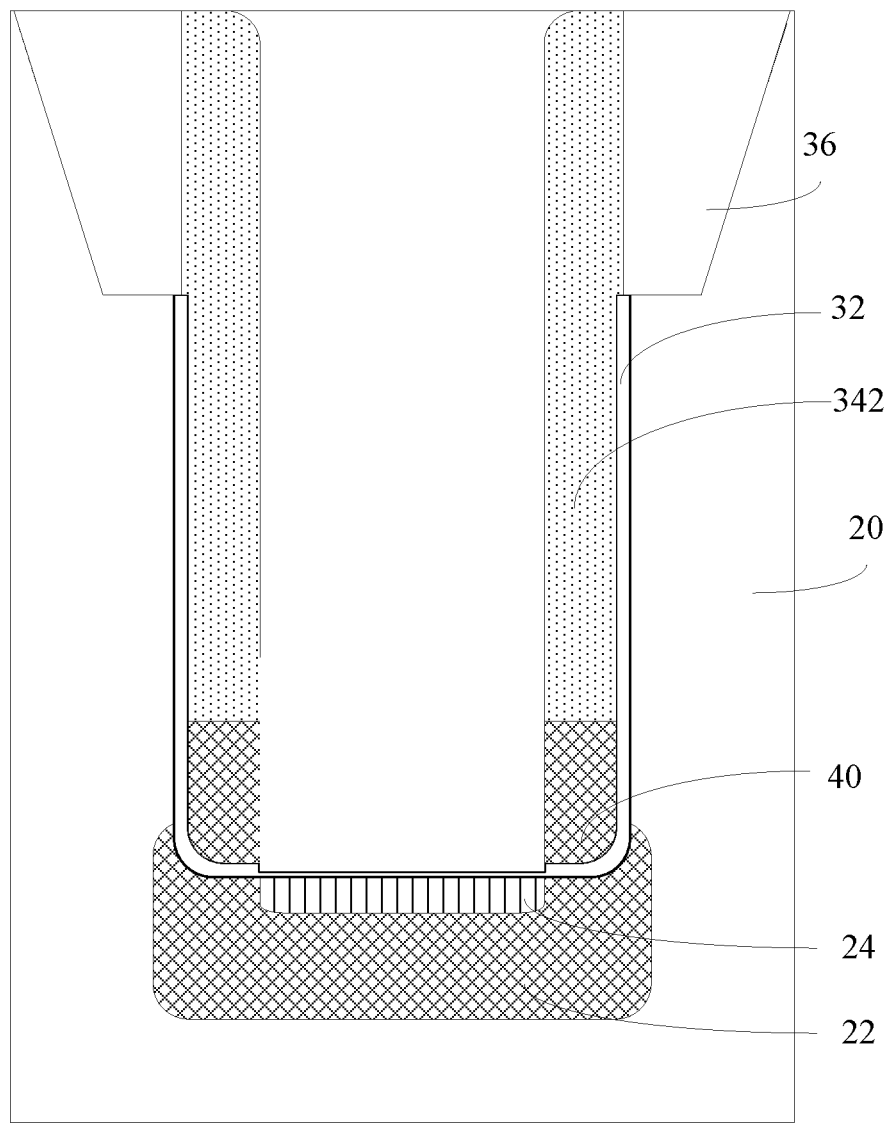

In this embodiment, ions of the second conductivity type are implanted into the first trench to form a second conductivity type base 22 under the first trench. Ions of the first conductivity type are then implanted to form an emitter doped region 24 of the first conductivity type in the second conductivity type base 22. In the step S180, the first insulating oxide layer 342 on the sidewall of the first trench is served as a blocking layer when the ions of the first and second conductivity types are implanted. A drive-in process is required after the ions of the second conductivity type are implanted. In order to ensure better insulation between the polysilicon gate 40 and the emitter doped region 24 in an embodiment, the drive-in is performed before the formation of the emitter doped region 24 by ion implantation, and thanks to the blocking of the first insulating oxide layer 342, the emitter doped region 24 does not substantially overlap with the polysilicon gate 40 along a lateral direction, as seen in FIG. 3f.

S190, forming a second insulating oxide layer in the first trench to insulate and isolate the polysilicon layer from the emitter doped region.

The second insulating oxide layer may be filled into the trench by a deposition process. In an embodiment, the first trench may be filled full by the second insulating oxide layer, while in another embodiment, the first trench may be filled by the second insulating oxide layer but not full. In an embodiment, the second insulating oxide layer at the bottom of the first trench may be etched away for additional processes after the deposition. After the additional processes, the first trench can be filled full by insulating oxide material.

S210, forming a first conductivity type buffer region, a collector doped region and a conductive plug.

Ions of the first conductivity type and the second conductivity type are respectively implanted on both sides of the first trench and obliquely above the emitter doped region 24 in the first conductivity type base 20 to form a first conductivity type buffer region 27 and a collector doped region 26 in the first conductivity type base 20. The second insulating oxide layer at the bottom of the first trench is etched to expose the second conductivity type base and the emitter doped regions 24, and the first trench is filled with a conductive material to form a conductive plug 50 that extends through the emitter doped region 24 and contacts the second conductivity type base 22. The collector doped region 26 is formed after the first conductivity type buffer region 27. The structure of the device after the step S210 can be seen in FIG. 1.

The etched second insulating oxide layer and the foregoing first insulating oxide layer can collectively form the insulating oxide layer 34 as mentioned in the description of the structure of the device.

Figure 4:
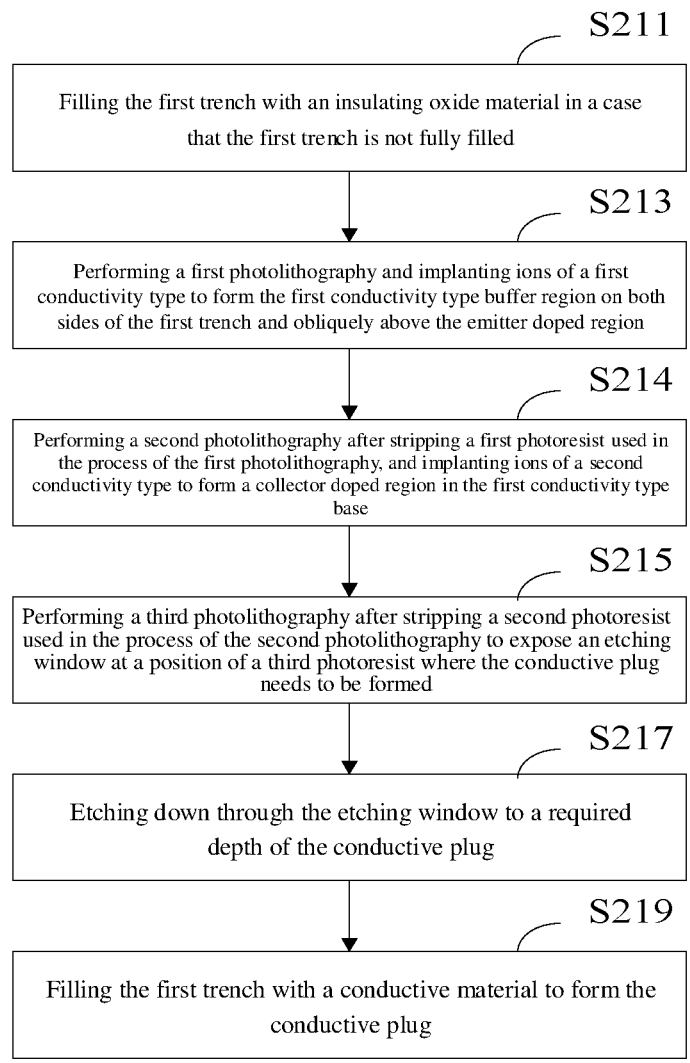
FIG. 4 is a flowchart of sub-steps of the step S210 of the method shown in FIG. 2 according to an embodiment.

FIG. 4 is a flowchart of sub-steps of the step S210 in an embodiment, which specifically includes:

S211, filling the first trench with an insulating oxide material in a case that the first trench is not fully filled.

Since photolithography is required in the next steps, the first trench is filled with an insulating oxide material to prevent a photoresist from being filled into the first trench which is otherwise difficult to be thoroughly removed.

S213, performing a first photolithography and implanting ions of the first conductivity type to form the first conductivity type buffer region on both sides of the first trench and obliquely above the emitter doped region.

A first photoresist is applied, and the first photolithography is then performed to expose the area where the first conductivity type buffer region is to be formed, and then the ions of the first conductivity type are implanted to form the first conductivity type buffer region.

S214, performing a second photolithography after stripping the first photoresist used in the process of the first photolithography, and implanting ions of the second conductivity type to form the collector doped region in the first conductivity type base.

The ions of the second conductivity type implanted into the first conductivity type base gather on top of the first conductivity type buffer region to form a collector doped region.

S215, performing a third photolithography after stripping a second photoresist used in the process of the second photolithography to expose an etching window at a position of a third photoresist where the conductive plug needs to be formed.

In an embodiment, a third insulating oxide layer is formed on the surface of the wafer to cover the collector doped region after stripping the second photoresist. The third photoresist is applied, and the third photolithography is then performed to expose an etching window at a position where the conductive plug needs to be formed. In an embodiment, the material of the third insulating oxide layer includes silicon oxide.

S217, etching down through the etching window to a required depth of the conductive plug.

In an embodiment, an etchant suitable for etching silicon oxide is used to etch down to the bottom of the first trench through the etching window. The third photoresist is then stripped, and an etchant suitable for etching silicon is used to continue etching to the required depth of the conductive plug by taking the third insulating oxide layer as an etching mask. The collector doped region will not be etched since it is protected by the third insulating oxide layer.

S219: filling the first trench with a conductive material to form the conductive plug.

In an embodiment, after the step S219, the method further includes a step of forming an interlayer dielectric (ILD) layer, a step of photolithography and etching the interlayer dielectric layer to form a contact hole, and a step of filling the contact hole with metal tungsten to form a tungsten plug to lead out the conductive plug and the collector doped region. Metal interconnection layers are subsequently used to provide electrical connection for the conductive plug and the collector doped region.

The above-mentioned embodiments represent a couple of implementation manners of the present disclosure only, with the descriptions thereof are relatively specific and detailed. However, they cannot be understood as limiting the scope of the disclosure. It should be noted that, for those of ordinary skill in the art, without departing from the concept of the present disclosure, modifications and improvements can be made, which all belong to the protection scope of the present disclosure. Therefore, the protection scope of the invention shall be subject to the appended claims.

The invention claimed is:

1. An insulated gate bipolar transistor, comprising:
a substrate;
a first conductivity type base disposed on the substrate and having a first trench extending downwardly from a surface thereof;
a first conductivity type buffer region disposed in the first conductivity type base and on both sides of the first trench;
a collector doped region having a second conductivity type and disposed in the first conductivity type base and on both sides of the first trench;
a second conductivity type base to which the first trench extends downwardly;
a gate oxide layer disposed on an inner surface of the first trench;
a polysilicon gate disposed inside the gate oxide layer, the first trench being partially filled with the polysilicon gate at part of the bottom and a sidewall thereof;
an emitter doped region having a first conductivity type, the emitter doped region being disposed in the second conductivity type base and under the first trench between the polysilicon gates;

a conductive plug extending downwardly from above the first trench and contacting the second conductivity type base after extending through the emitter doped region; and
an insulating oxide layer filled in the first trench between the conductive plug and the polysilicon gate, the insulating oxide layer covering the polysilicon gate and insulating and isolating the polysilicon gate from the emitter doped region;
wherein the first conductivity type and the second conductivity type are opposite conductivity types.

2. The insulated gate bipolar transistor according to claim 1, further comprising an isolation structure disposed between the collector doped region and the first trench.

3. The insulated gate bipolar transistor according to claim 2, wherein the isolation structure is a shallow trench isolation structure.

4. The insulated gate bipolar transistor according to claim 2, wherein the isolation structure is field oxide formed by local oxidation of silicon.

5. The insulated gate bipolar transistor according to claim 1, further comprising:
a second trench;
a gate lead-out structure deposited from the bottom of the second trench and extending out of the second trench.

6. The insulated gate bipolar transistor according to claim 1, wherein the material of the conductive plug comprises metal.

7. The insulated gate bipolar transistor according to claim 1, wherein the material of the conductive plug comprises alloy.

8. The insulated gate bipolar transistor according to claim 1, wherein the materials of the conductive plug comprise metal and metal nitride.

9. The insulated gate bipolar transistor according to claim 1, wherein the material of the insulating oxide layer comprises silicon oxide.

10. The insulated gate bipolar transistor according to claim 1, wherein the first conductivity type buffer region is disposed under the collector doped region.

11. The insulated gate bipolar transistor according to claim 1, wherein the first conductivity type is N-type and the second conductivity type is P-type.

12. A manufacturing method for an insulated gate bipolar transistor, comprising steps:
S110, providing a wafer having a first conductivity type base formed on a substrate;
S120, forming a trench extending downwardly from a surface of the first conductivity type base, the trench comprising a first trench;
S130, forming a gate oxide layer on an inner surface of the first trench;
S140: filling the first trench full with polysilicon;
S150, etching the polysilicon to a predetermined thickness, and forming a polysilicon layer of the predetermined thickness at the bottom of the first trench;
S160, forming a first insulating oxide layer on a surface of the polysilicon layer and a sidewall of the first trench;
S170, etching the first insulating oxide layer and the polysilicon layer downward to expose the bottom of the first trench with a part of the polysilicon layer and the first insulating oxide layer located at the sidewall of the first trench being retained;

S180, forming a second conductivity type base under the first trench and forming an emitter doped region of the first conductivity type in the second conductivity type base;

S190, forming a second insulating oxide layer in the first trench to insulate and isolate the polysilicon layer from the emitter doped region; and S210, forming a first conductivity type buffer region, a collector doped region and a conductive plug;

wherein the first conductivity type and the second conductivity type are opposite conductivity types.

13. The manufacturing method according to claim 12, wherein the wafer provided in the step S110 is further formed with an isolation structure; and wherein the step S120 comprises etching through a part of the isolation structure after performing photolithography, and then etching the first conductivity type base downward to form the first trench by taking a part of the isolation structure protected from being etched by a photoresist as a hard mask.

14. The manufacturing method according to claim 12, wherein the step S120 further comprises forming a second trench simultaneously;

wherein the step S130 further comprises forming a gate oxide layer on an inner surface of the second trench simultaneously;

wherein the step S140 further comprises filling the second trench full with polysilicon; and wherein the step S150 comprises etching after performing photolithography by which a photoresist is formed to at least partially block the polysilicon in the second trench, thereby forming a gate lead-out structure that extends out of the second trench after etching.

15. The manufacturing method according to claim 12, wherein the step S210 comprises steps:

S211, filling the first trench with an insulating oxide material in a case that the first trench is not fully filled;

S213, performing a first photolithography and implanting ions of the first conductivity type to form the first conductivity type buffer region on both sides of the first trench and obliquely above the emitter doped region;

S214, performing a second photolithography after stripping a first photoresist used in the process of the first photolithography, and implanting ions of the second conductivity type to form the collector doped region in the first conductivity type buffer region;

S215, performing a third photolithography after stripping a second photoresist used in the process of the second photolithography to expose an etching window at a position of a third photoresist where the conductive plug needs to be formed;

S217, etching down through the etching window to a required depth of the conductive plug; and S219, filling the first trench with a conductive material to form the conductive plug.

16. The manufacturing method according to claim 15, wherein the step S215 comprises performing the third photolithography after forming a third insulating oxide layer on a surface of the collector doped region after stripping the second photoresist; and wherein the step S217 comprises using an etchant suitable for etching silicon oxide to etch downward to the bottom of the first trench through the etching window, and then stripping the third photoresist followed by using a second etchant to continue etching to the required depth of the conductive plug by taking the third insulating oxide layer as an etching mask.

17. The manufacturing method according to claim 12, wherein the step S170 comprises:

etching back the first insulating oxide layer, a part of the first insulating oxide layer that is located on the sidewall of the first trench being retained after the etching back and another part that located in the middle of the first trench being etched away to expose the polysilicon gate, wherein an etchant suitable for etching silicon oxide is used for the etching back without any usage of photoresist; and etching the polysilicon gate by taking the retained first insulating oxide layer as a mask to expose the bottom of the first trench.

18. The manufacturing method according to claim 12, wherein the step S180 comprises:

implanting the ions of the second conductivity type into the first trench by taking the retained first insulating oxide layer as a blocking layer, and performing drive-in to form the second conductivity type base under the first trench; and after drive-in, implanting the ions of the first conductivity type to form the emitter doped region in the second conductivity type base by taking the retained first insulating oxide layer as a blocking layer.

19. The manufacturing method according to claim 12, wherein, after forming the conductive plug, the step S210 further comprising:

forming an interlayer dielectric layer;

performing photolithography and etching the interlayer dielectric layer to form a contact hole; and filling the contact hole with metal tungsten to form a tungsten plug to lead out the conductive plug and the collector doped region.

20. The manufacturing method according to claim 12, wherein the first conductivity type is N-type, and the second conductivity type is P-type.

* * * * *